United States Patent
Abdo et al.

(10) Patent No.: US 9,893,027 B2
(45) Date of Patent: Feb. 13, 2018

(54) PRE-PLATED SUBSTRATE FOR DIE ATTACHMENT

(71) Applicant: FREESCALE SEMICONDUCTOR, INC., Austin, TX (US)

(72) Inventors: David F. Abdo, Tempe, AZ (US); Sivanesan A/L Sathiapalan, Kuala Lumpur (MY)

(73) Assignee: NXP USA, INC., Austin, TX (US)

( * ) Notice: Subject to any disclaimer, the term of this patent is extended or adjusted under 35 U.S.C. 154(b) by 108 days.

(21) Appl. No.: 15/093,713

(22) Filed: Apr. 7, 2016

(65) Prior Publication Data
US 2017/0294393 A1 Oct. 12, 2017

(51) Int. Cl.
*H01L 21/44* (2006.01)
*H01L 23/48* (2006.01)
*H01L 23/00* (2006.01)

(52) U.S. Cl.
CPC .............. *H01L 24/05* (2013.01); *H01L 24/03* (2013.01); *H01L 24/80* (2013.01); *H01L 2224/0312* (2013.01); *H01L 2224/03019* (2013.01); *H01L 2224/03462* (2013.01); *H01L 2224/05547* (2013.01); *H01L 2224/05568* (2013.01); *H01L 2224/05582* (2013.01); *H01L 2224/05601* (2013.01); *H01L 2224/05611* (2013.01); *H01L 2224/80048* (2013.01); *H01L 2224/80355* (2013.01); *H01L 2224/80359* (2013.01); *H01L 2924/01079* (2013.01); *H01L 2924/1033* (2013.01)

(58) Field of Classification Search
USPC .......................... 438/106, 118, 406, 455, 612
See application file for complete search history.

(56) References Cited

U.S. PATENT DOCUMENTS

| | | | | |
|---|---|---|---|---|
| 4,978,052 | A * | 12/1990 | Fister | H01L 23/49866 156/325 |
| 6,399,182 | B1 * | 6/2002 | Rubel | H01L 23/13 156/153 |
| 7,608,485 | B2 | 10/2009 | Hong et al. | |
| 8,970,010 | B2 | 3/2015 | Radulescu et al. | |
| 2006/0108672 | A1 | 5/2006 | Brennan et al. | |
| 2007/0141749 | A1 | 6/2007 | Lin et al. | |
| 2010/0105172 | A1 * | 4/2010 | Li | H01L 24/83 438/118 |
| 2010/0295168 | A1 * | 11/2010 | Feng | H01L 21/486 257/698 |
| 2014/0084302 | A1 * | 3/2014 | Hosseini | H01L 23/3171 257/77 |
| 2015/0318254 | A1 * | 11/2015 | Thacker | H01L 24/08 257/737 |

* cited by examiner

*Primary Examiner* — Moin Rahman

(57) ABSTRACT

A method for attaching a semiconductor die to a substrate includes providing a substrate that includes an attachment layer at a surface of the substrate. The attachment layer is covered by a protective flash plating layer. The protective flash plating layer has a reflow temperature less than or equal to a reflow temperature of the attachment layer. The method further includes preheating the substrate to a temperature greater than or equal to a reflow temperature of the attachment layer, attaching a semiconductor die to the attachment layer, and cooling the substrate and semiconductor die.

9 Claims, 2 Drawing Sheets

US 9,893,027 B2

PRE-PLATED SUBSTRATE FOR DIE ATTACHMENT

BACKGROUND

The present invention is directed to attaching semiconductor dies to substrates and, more particularly, to attaching gold/tin (AuSn) pre-plated substrates to gallium nitride dies.

High power devices, such as those used in radio frequency (RF) applications, often require die attachment using oxidation sensitive materials, such as AuSn. Thus, the die attachment process is constrained by steps that cater to the oxidation sensitivity, which can be complex and costly. Other methods, such as providing an AuSn interface on a device back side can also be complex and costly.

Gallium nitride (GaN) die attachment in particular can be challenging aside from the requirement for AuSn preform attachment. In particular, GaN dies tend to be very thin chips with vias. The use of preforms coupled with ultra-thin dies requires extremely flat surfaces and an unreasonable level of preform volume consistency and force stability to achieve good yields. Unfortunately, the current procedures have many yield issues that can be sporadic and inconsistent per lot.

For example, present methods for GaN die attachment begin by preheating a gold pre-plated substrate to a pre-tack temperature of about 260-270° C. An AuSn precut preform is then placed on the heated substrate for pre-tack. A GaN die is thereafter attached to the preform via a pick and place collet or the like. With the GaN die in position, the temperature of the substrate is ramped up to about 310° C. to reflow the AuSn preform. The GaN is scrubbed using the collet to ensure sufficient diffusion. Finally, the collet releases the die and the substrate is cooled to below 260° C.

The cycle time for this process is relatively lengthy—typically about thirty-five (35) seconds as opposed to about five (5) seconds for non-GaN devices, or seven (7) times longer. The process also often results in yield issues, including excessive solder overflow and shorts, incomplete wettings, die cracking, and voids attributable to the use of preforms.

AuSn wafer back metal processes also suffer from drawbacks. In particular, back side AuSn chipping can impact die attachment quality. The AuSn is also exposed, and can therefore suffer from oxidation during handling prior to die attachment.

It is therefore desirable to provide a substrate that can improve cycle times and reduce yield issues.

BRIEF DESCRIPTION OF THE SEVERAL VIEWS OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

In the drawings.

DETAILED DESCRIPTION

In one embodiment, the present invention provides a method for attaching a semiconductor die to a substrate. The method includes providing a substrate. The substrate includes an attachment layer at a surface of a substrate. The attachment layer is covered by a protective flash plating layer. The protective flash plating layer has a reflow temperature less than or equal to a reflow temperature of the attachment layer. The method further includes preheating the substrate to a temperature greater than or equal to a reflow temperature of the attachment layer, attaching a semiconductor die to the attachment layer, and cooling the substrate and semiconductor die.

In another embodiment, the present invention provides a method of preparing a substrate for attachment to a semiconductor die. The method includes providing a substrate, and selectively forming an attachment layer on a surface of the substrate at one or more die attachment locations. The attachment layer has a reflow temperature. The method further includes covering the attachment layer with a protective flash plating layer. The protective flash plating layer has a reflow temperature that is less than or equal to the reflow temperature of the attachment layer.

In yet another embodiment, the present invention provides a semiconductor device including a substrate having a surface for attachment to a semiconductor die, and an attachment layer disposed on the surface of the substrate at one or more die attachment locations. The attachment layer has a reflow temperature. A protective flash plating layer covers the attachment layer. The protective flash plating layer has a reflow temperature that is less than or equal to the reflow temperature of the attachment layer.

Figure 1:
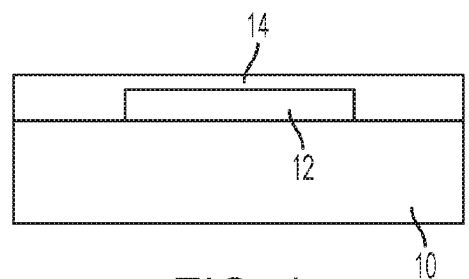
FIG. 1 is a cross-sectional side elevational view of a substrate for attachment to a semiconductor die in accordance with a preferred embodiment of the present invention.
Figure 2:
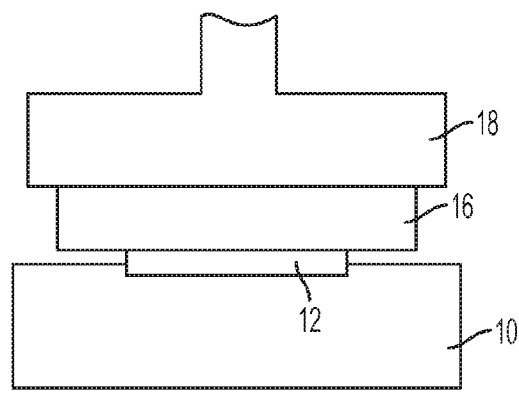
FIG. 2 is a cross-sectional side elevational view of the substrate of FIG. 1 brought into contact with the semiconductor die.
Figure 3:
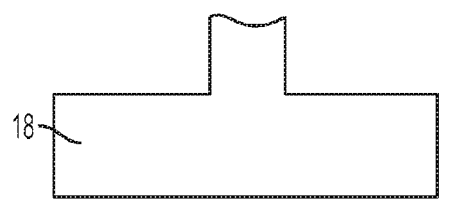
FIG. 3 is a cross-sectional side elevational view of the substrate of FIG. 2 following attachment to the semiconductor die.
Figure 3:
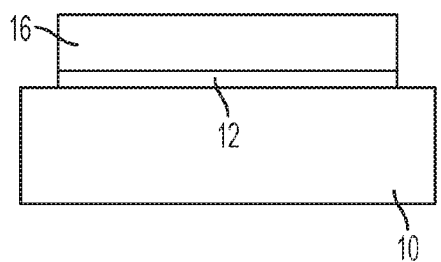

Referring now to the drawings, wherein the same reference numerals are used to designate the same components throughout the several figures, there is shown in FIGS. 1-3 a preferred embodiment of a method for attaching a semiconductor die to a substrate according to the present invention. As shown in FIG. 1, a substrate 10 is provided for die attachment. The substrate is preferably formed from a metal, such as copper (Cu), copper alloy, or a combination of copper and other metals, such as molybdenum (Mo), tungsten (W), or the like, for high thermal conductivity and/or coefficient of thermal expansion (CTE) matching. The substrate 10 can also be made from non-metals, such as diamond, silicon carbide, or the like. The substrate 10 may be pre-plated with gold or the like at one or more surfaces thereof.

The substrate 10 includes an attachment layer 12 provided at a surface of the substrate 10. In preferred embodiments, the attachment layer 12 is preferably formed of AuSn, although other materials may be used as well. In addition, the AuSn is preferably in the form of a eutectic alloy, although it may include individual layers of each element, or other potential combinations and mixtures. The attachment layer 12 may include a single or multiple spaced apart or connected components, branches, or the like, and may have flat or textured topography. While the particular shape and layout of the attachment layer 12 is not critical to embodiments of the present invention, the attachment layer 12 should be designed to provide sufficient structural and/or electrical connections, as described in later steps, below.

The attachment layer 12 is covered by a protective flash plating layer 14, which is preferably provided to prevent oxidation or other damage and/or corrosion of the attachment layer 12 prior to die attachment processes described below. In the region above the attachment layer 12, the protective flash plating layer 14 preferably has a thickness of about 10 micro-inches or less.

The protective flash plating layer 14 is preferably made from gold, particularly when the attachment layer 12 is formed from AuSn, although other materials may be used as well. The attachment layer 12 and the protective flash plating layer 14 each have a reflow temperature, and preferably the reflow temperature of the protective flash plating layer 14 is less than or equal to a reflow temperature of the attachment layer 12.

The substrate 10 is preheated to a temperature greater than or equal to the reflow temperature of the attachment layer 12. Since the reflow temperature of the protective flash plating layer 14 is less than or equal to the attachment layer 12 reflow temperature, the protective flash plating layer 14 also melts during preheating to permit access to the attachment layer 12. In preferred embodiments, the substrate 10 is preheated to a temperature of about 310° C., which is sufficient to reflow gold and AuSn.

Referring to FIG. 2, a semiconductor die 16 is attached to the attachment layer 12. In FIG. 2, the semiconductor die 16 is held by a collet 18 that brings a surface of the semiconductor die 16 into contact with the preheated substrate 10. The semiconductor die 16 is preferably a GaN die, although other types of semiconductor material or combinations of materials, such as gallium arsenide, silicon germanium, silicon-on-insulator (SOI), silicon, monocrystalline silicon, the like, and combinations of the above, may be used as well. The collet 18 is preferably further used to scrub the semiconductor die 16 on the attachment layer 12 to create sufficient contact for a secure bond.

Referring to FIG. 3, the collet 18 is preferably removed from the semiconductor die 16, and the substrate 10 and semiconductor die 16 are cooled to allow the attachment layer 12 to solidify. In preferred embodiments, the substrate 10 and semiconductor die 16 are cooled to a temperature below about 260° C., whereupon attachment is complete. The substrate 10 may be removed and the heater (not shown) ramps back up to preferably about 310° C. for the next substrate 10 in production.

Figure 4:
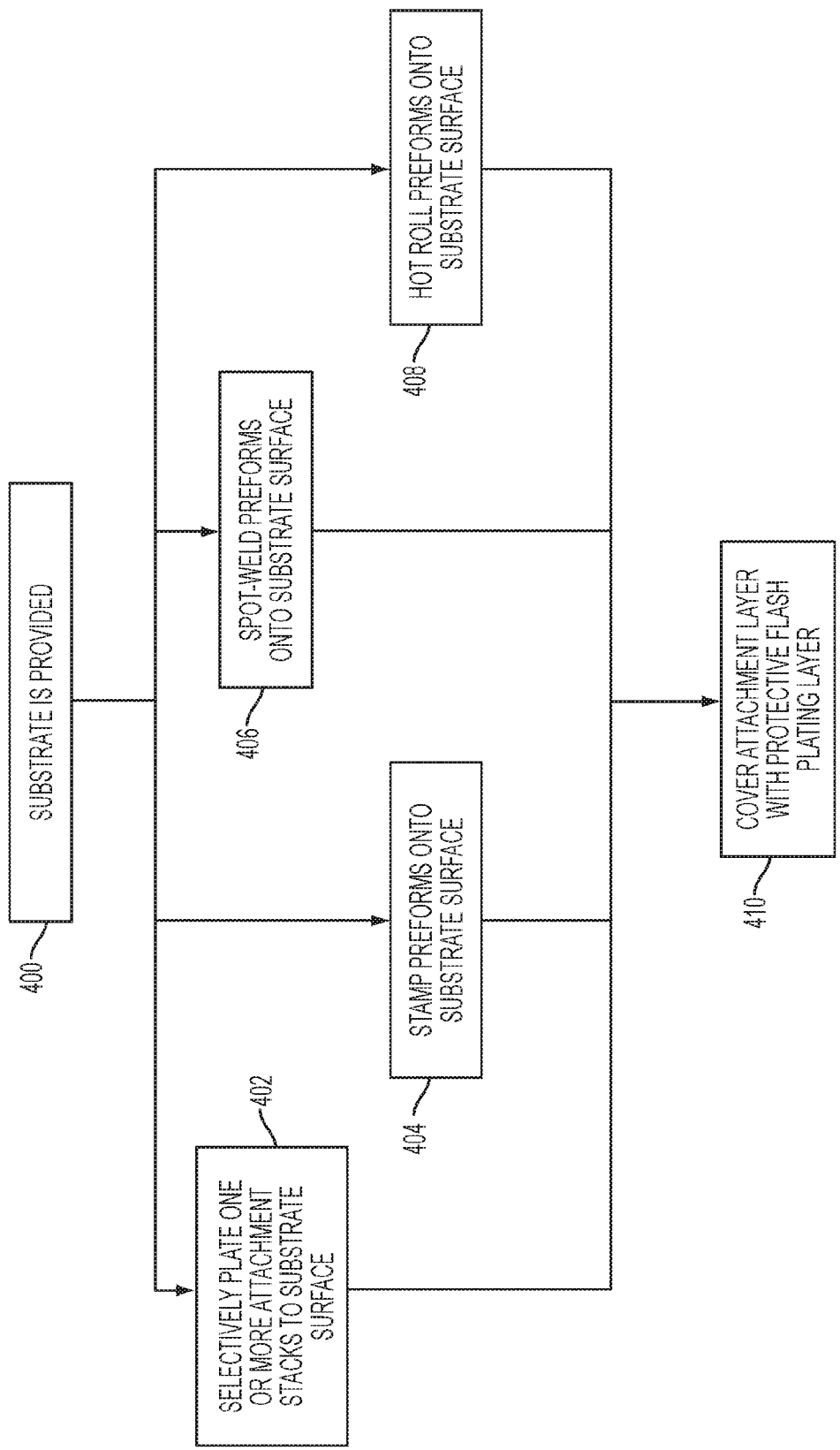
FIG. 4 is a flow chart describing a number of methods for preparing the substrate of FIG. 1 in accordance with various embodiments of the present invention.

Referring to FIG. 4, a method for preparing a substrate 10 for attachment to a semiconductor die 16 in accordance with several embodiments of the present invention is described. Initially at step 400, the substrate 10 is provided, preferably already with any necessary plating. The attachment layer 12 is then selectively formed on a surface of the substrate 10 at one or more die attachment locations (i.e., desired locations for the connections to the semiconductor die 16).

FIG. 4 provides several alternatives for forming the attachment layer 12. In one embodiment (step 402), the attachment layer 12 is formed by selectively plating one or more attachment stacks (see e.g., FIG. 1) to the surface of the substrate 10. The stacks can be formed in one plating step or can be formed in layers.

In other embodiments, the attachment layer 12 can be made from one or more preforms, which are conventionally known. In one embodiment (step 404), the preforms are selectively stamped onto the surface of the substrate 10 at the die attachment locations. Mechanical stiction can be used to hold the preforms in place until later steps. In another embodiment (step 406), the preforms can be spot welded, using conventional techniques, to the die attachment locations. In particular, the preforms are preferably spot-welded at diagonal corners of each die attachment location. In yet another embodiment (step 408), the preforms can be hot rolled, for example with a heated rough roller (not shown), to the substrate 10 surface. However, other methods for providing the attachment layer 12 can be used as well in keeping with the invention.

At step 410, the attachment layer 12, regardless of the method formed, is covered by the protective flash plating layer 14. The protective flash plating layer 14 is preferably plated onto the substrate 10 using conventional techniques, and serves to lock in the attachment layer 12 and prevent oxidation. Au plating (for the flash layer 14) as well as AuSn pre-plating (for the attach layer 12) can be done in several ways. At the maximum, the entire surface of the substrate 10 could have AuSn pre-plating, in which case the entire surface of the substrate 10 would need Au flash 14 (i.e., everywhere there can be exposed AuSn 12 there would be Au flash 14). If only a select area on the substrate 10 has AuSn pre-plating 12, as shown in FIG. 1, then only that area needs to be covered with the Au flash 14, plus some overlap to ensure there is no exposed AuSn. The Au Flash 14 does not need to extend over the entire surface of the substrate 10, especially if that surface already has some level of Au plating. The area for the AuSn 12 and Au flash 14 at a minimum just need to cover the area required for die attach.

Embodiments of the present invention provide numerous significant benefits and advantages not seen in other die attachment solutions. For example, embodiments of the present invention remove the need for manually loading preforms on waffle packs for die attachment, since the substrates 10 are already provided with the attachment layer 12. This is particularly beneficial when placing multiple dies in a package, such as in RF applications. Similarly, the variable for incorrectly positioned preforms during tack is removed, and the attachment layer 12 placement is uniform, as compared to preforms that tend to pull to one side during reflow.

In addition, since the pre-tack procedure of attaching preforms is not needed, embodiments of the present invention eliminate the need for the long heater ramp up time from the pre-tack temperature to the reflow temperature. The need to design different preforms for different new semiconductor die 16 sizes is also eliminated since the attachment layer 12 is already pre-plated in the die attachment areas. This also means fewer part numbers to manage and optimize. Preheated semiconductor dies 16 are also not an issue with embodiments of the present invention, particularly since the backmetal on a GaN die is pure gold. As a result of these and other advantages, GaN die attachment can be performed seven or eight times faster than with the conventional process.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A method for attaching a semiconductor die to a substrate, the method comprising:

providing a substrate, the substrate including an attachment layer at a surface of the substrate, the attachment layer directly overlaid by a protective flash plating layer to cover the attachment layer, the protective flash plating layer having a reflow temperature less than or equal to a reflow temperature of the attachment layer;

preheating the substrate to a temperature greater than or equal to a reflow temperature of the attachment layer, wherein the protective flash plating layer melts during the preheating to permit access to the attachment layer;

attaching a semiconductor die to the attachment layer while the flash plating layer is melted, wherein the semiconductor die and the attachment layer are in direct contact; and cooling the substrate and semiconductor die.

2. The method of claim 1, wherein the protective flash plating layer is made from gold.

3. The method of claim 2, wherein the protective flash plating layer has a thickness in a region above a surface of the attachment layer of about 10 micro-inches or less.

4. The method of claim 1, wherein the attachment layer is made from a combination of gold and tin.

5. The method of claim 1, wherein the substrate is preheated to a temperature of about 310° C.

6. The method of claim 1, wherein the semiconductor die is formed of gallium nitride.

7. The method of claim 1, wherein the substrate is gold plated.

8. The method of claim 1, wherein the substrate and semiconductor die are cooled to a temperature below about 260° C.

9. The method of claim 1, further comprising scrubbing the semiconductor die on the attachment layer.

* * * * *